United States Patent [19]
Maeda

[11] Patent Number: 6,128,352
[45] Date of Patent: Oct. 3, 2000

[54] RECEIVING APPARATUS FOR PERFORMING DIGITAL BROADCAST CHANNEL SELECTION AND DEMODULATION

[75] Inventor: Shunji Maeda, Tokyo, Japan

[73] Assignee: Sony Corporation, Tokyo, Japan

[21] Appl. No.: 08/958,443

[22] Filed: Oct. 27, 1997

[30] Foreign Application Priority Data

Nov. 7, 1996 [JP] Japan .................................. 8-295288

[51] Int. Cl.$^7$ .................................................. H03K 9/00
[52] U.S. Cl. .......................... 375/316; 348/731; 348/732
[58] Field of Search ........................... 375/316; 348/553, 348/725, 731, 732

[56] References Cited

U.S. PATENT DOCUMENTS

| | | | |
|---|---|---|---|
| 3,859,599 | 1/1975 | Peil | 325/419 |
| 4,280,140 | 7/1981 | Skerlos | 358/195.1 |
| 4,295,165 | 10/1981 | Watanabe et al. | 358/193.1 |
| 4,302,778 | 11/1981 | Tanaka | 358/195.1 |
| 5,636,250 | 6/1997 | Scarpa | 375/321 |
| 5,654,774 | 8/1997 | Pugel et al. | 348/725 |
| 5,715,012 | 2/1998 | Patel et al. | 348/555 |
| 5,805,241 | 9/1998 | Limberg | 348/725 |

FOREIGN PATENT DOCUMENTS 0 469301A2  2/1992  European Pat. Off. .
2 247 796A   3/1992  United Kingdom .

*Primary Examiner*—Stephen Chin
*Assistant Examiner*—Mohammad Ghayour
*Attorney, Agent, or Firm*—Ronald P. Kananen; Rader, Fishman & Grauer

[57] ABSTRACT

A receiving apparatus capable of shortening the channel search time comprising a channel selection circuit comprising a channel selection control circuit which sets the oscillation frequency of a local oscillation circuit shifted over the entire area in the frequency bandwidth when a control signal is received and sets the oscillation frequency to a designated frequency when another control signal is received, a mixing circuit which mixes a high frequency signal with a local oscillation signal to convert the same to an intermediate frequency signal, and an AGC which amplifies the intermediate frequency signal at the time of input of the control signal and adjusts the intermediate frequency signal level to a predetermined level at the time of non-input; a discrimination circuit which discriminates each position of the received channel by a digital signal; and a control circuit which outputs the control signal to the channel selection control circuit and the AGC, makes the discrimination circuit discriminate the channel positions, and then stops the output of the control signal and outputs the second control signal for setting the frequency of the local oscillation circuit by the result of discrimination of the discrimination circuit to the channel selection control circuit.

18 Claims, 4 Drawing Sheets

RECEIVING APPARATUS FOR PERFORMING DIGITAL BROADCAST CHANNEL SELECTION AND DEMODULATION

BACKGROUND OF THE INVENTION

1. Field of the Invention

The present invention relates to a receiving apparatus applied to a digital satellite television broadcasting system etc., more particularly relates to an improvement of the channel search circuit.

2. Description of the Related Art

In recent digital satellite television broadcasting, different frequency bands are allocated to channels in for example the 20 MHz frequency bandwidth from 12.000 GHz to 12.020 GHz. However, the frequencies are not always fixed. This is because broadcasting services themselves are still not fully developed and there is a possibility of change of the bandwidth of the channels due to changes in the content of the services etc.

Further, since a satellite is utilized, there are cases where unusable channels are caused due to trouble in the transponder or other transmission apparatuses. For this reason, depending on the tuner for the digital satellite television broadcasting system, it sometimes becomes necessary to performing a full channel search at the user side at the point of time when there is a change in the channels at the time of purchase.

In this case, the carrier frequency of each channel is not always defined by the standards, so it is necessary to perform the demodulation operation while shifting the frequency little by little in the band.

A demodulation operation in digital television broadcasting generally takes a long time, however, unlike a demodulation operation in analog television broadcasting. This is because it is necessary to monitor a certain amount of the data to correct error. For example, in the case of the DVB (European Project Digital Video Broadcasting) system, a correct signal can be obtained only after going through processing such as QPSK (quadrature phase shift keying), Viterbi decoding, Reed Solomon decoding, etc. For this reason, a full channel search takes a considerably long time as a whole.

SUMMARY OF THE INVENTION

An object of the present invention is to provide a receiving apparatus capable of shortening the channel search time.

To attain the above object, the present invention provides a receiving apparatus which receives a high frequency signal having individual frequencies allocated as channels in a predetermined frequency bandwidth and demodulates the data of a channel, comprising; a local oscillation circuit for generating a variable oscillation frequency, a channel selection control circuit for setting the oscillation frequency of the local oscillation circuit shifted over the entire area in the frequency bandwidth when a first control signal is received and sets the oscillation frequency of the local oscillation circuit to a frequency designated by a second control signal when a second control signal is received, a mixing circuit for mixing the received high frequency signal with the local oscillation signal from the local oscillation circuit to convert the same to an intermediate frequency signal which it then outputs and provision is made of a discrimination circuit for receiving an intermediate frequency signal output from the mixing circuit and discriminates the position of each channel in the entire area in the frequency bandwidth and a control circuit for outputting the first control signal to the channel selection control circuit of the channel selection circuit to discriminate the channel positions over the entire area in the frequency bandwidth by the discrimination circuit which it then outputs the second control signal for setting the frequency of the local oscillation circuit to the channel selection control circuit based on the result of discrimination of the discrimination circuit.

Further, the present invention provides a receiving apparatus which receives a high frequency signal having individual frequencies allocated as channels in a predetermined frequency bandwidth and demodulates the data of a channel, comprising; a local oscillation circuit for generating a variable oscillation frequency, channel selection control circuit for setting the oscillation frequency of the local oscillation circuit shifted over the entire area in the frequency bandwidth when a first control signal is received and the sets oscillation frequency of the local oscillation circuit t a frequency designated by a second control signal when a second control signal is received, a mixing circuit for mixing the received high frequency signal with the local oscillation signal from the local oscillation circuit to convert the same to an intermediate frequency signal which it then outputs, a gain adjustment circuit for amplifying the intermediate frequency signal from the mixing circuit with a predetermined gain at the time of input of the first control signal and adjusts the level of the intermediate frequency signal to a level set in advance at the time of non-input of the first control signal, a discrimination circuit for receiving an intermediate frequency signal output from the mixing circuit and discriminates the position of each channel in the entire area in the frequency bandwidth and a control circuit for outputting the first control signal to the channel selection control circuit and the gain adjustment circuit of the channel selection circuit, causes the discrimination circuit to discriminate the channel positions over the entire area in the frequency bandwidth, then stops the output of the first control circuit and outputs the second control signal for setting the frequency of the local oscillation circuit to the channel selection control circuit based on the result of discrimination of the discrimination circuit.

Further, in the present invention, the control circuit holds the demodulation circuit in a non-operation state at a time of output of the first control signal and operates the demodulation circuit at a time of non-output of the first control signal.

Further, in the present invention, the discrimination circuit compares the level of the input intermediate frequency signal with at least one reference level set in advance so as to discriminate the position of a received channel.

For example, the discrimination circuit discriminates the position of a received channel from the level of the intermediate frequency signal larger or smaller than the reference level.

Further, in the receiving apparatus of the present invention, the discrimination circuit discriminates the position of a received channel by detecting a point of change of inclination of the input intermediate frequency signal. For example, the discrimination circuit discriminates the position of a received channel by detecting a point of change of inclination of a peak portion or a valley portion of the input intermediate frequency signal.

Further, in the receiving apparatus of the present invention, provision is made of a storing means for storing the result of discrimination of the discrimination circuit; and the control circuit generates the second control signal based on the information stored in the storing means.

According to the receiving apparatus of the present invention, a high frequency signal sent from for example a broadcast satellite is received at the channel selection circuit and input to the mixing circuit. In the mixing circuit, the received high frequency signal is mixed with the local oscillation signal from a local oscillation circuit to convert the same to and intermediate frequency signal and input to for example a gain adjustment circuit. In this case, the gain adjustment function has been deactivated in the gain adjustment circuit. Accordingly, the intermediate frequency signal is amplified with a predetermined gain and output to the discrimination circuit.

Further, at this time, the first control signal has been input to the channel selection control circuit by the control circuit, and the oscillation frequency of the local oscillation circuit is set shifted over the entire area in the frequency bandwidth. Namely, the channel search is carried out over the entire area. At this time, the demodulation circuit is held in a stopped state by the control circuit.

The discrimination circuit to which the intermediate frequency signal was input compares, for example, the level thereof with a reference level set in advance and discriminates the position of a received channel from the level of the intermediate frequency signal larger or smaller than the reference level. The result of discrimination is stored in for example a storing means.

When the high speed channel search over the entire area of this frequency bandwidth is ended, the control circuit generates a second control signal for setting the oscillation frequency of the local oscillation circuit to a frequency based on the channel position information in the frequency bandwidth stored in the storing means and outputs the same to the channel selection control circuit. Further, at this time, the demodulation circuit is switched to the operation state by the control circuit. Simultaneously, the input of the first control signal to the gain adjustment circuit is stopped. Along with this, the gain adjustment circuit enters the gain adjustment mode, and the level-adjusted intermediate frequency signal is input to the demodulation circuit.

By this, a channel is selectively searched for based on a rough channel position specified in the discrimination circuit not in the entire area In the frequency bandwidth. The intermediate frequency signal which is obtained by this selective search and is adjusted in level is input to the demodulation circuit. The demodulation operation is selectively carried out with respect to the selected channel signal in the demodulation circuit to obtain the data of the channel.

BRIEF DESCRIPTION OF THE DRAWINGS

The above and other objects and features of the present invention will be described more in detail with reference to the accompanying drawings, in which.

DETAILED DESCRIPTION OF THE PREFERRED EMBODIMENTS

Below, an explanation will be made of a receiving apparatus according to an embodiment of the present invention.

Figure 1:
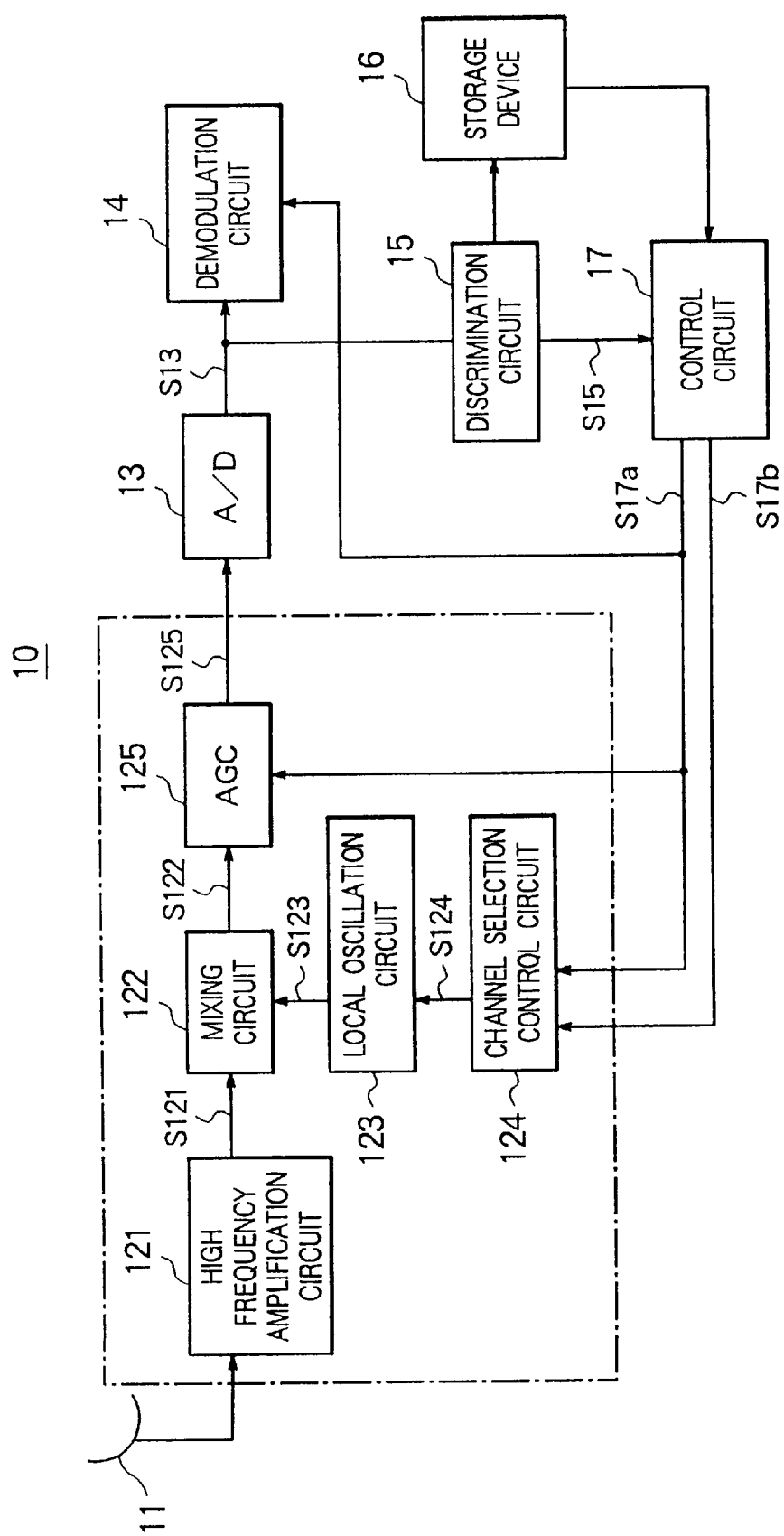
FIG. 1 is a circuit diagram of an embodiment of a receiving apparatus according to the present invention.

FIG. 1 is a circuit diagram of an embodiment of a digital television broadcasting use receiving apparatus according to the present invention.

The receiving apparatus 10 Is constituted by a reception antenna 11, a tuner 12, an analog/digital (A/D) converter 13, a demodulation circuit 14, a discrimination circuit 15, a storage device 16, and a control circuit 17.

The tuner 12 is constituted by, as shown in FIG. 1, a high frequency amplification circuit 121, a mixing circuit 12.2, a local oscillation circuit 123, a channel selection control circuit 124, and an automatic gain control circuit (AGC) 125.

The high frequency amplification circuit 121 amplifies a high frequency signal transmitted from the broadcast satellite, received at the reception antenna 11, and having individual frequencies within a predetermined frequency bandwidth allocated as channels and outputs the result as the signal S121 to the mixing circuit 122.

Figure 2:
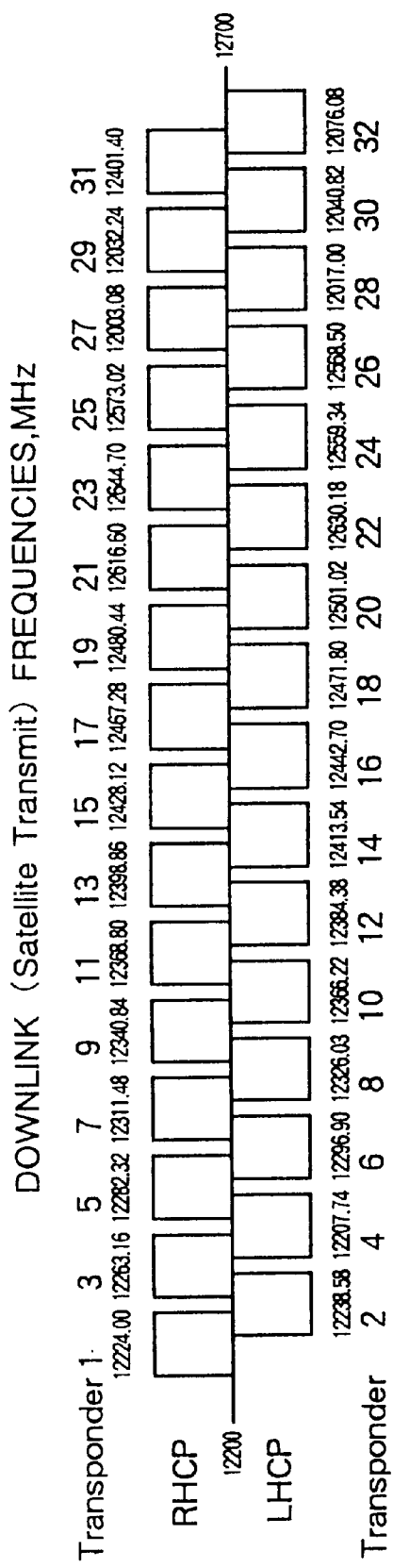
FIG. 2 is a view of an example of allocation of frequencies to channels in a digital television broadcast use high frequency signal.

FIG. 2 shows an example of the allocation of frequencies to channels in a digital television broadcast use high frequency signal. In this example, frequencies (unit: MHz) are allocated to channels 1 to 32 at predetermined intervals.

The mixing circuit 122 mixes an output signal S121 of the high frequency amplification circuit 121 with a local oscillation signal S123 from the local oscillation circuit 123 to convert the same to an intermediate frequency signal which it then outputs as a signal S122 to the AGC 125.

The local oscillation circuit 123 oscillates at a frequency in accordance with the instruction of an out signal S124 of the channel selection control circuit 124 and outputs the local oscillation signal S123 oscillated at that frequency to the mixing circuit 123.

The channel selection control circuit 124 outputs the signal S124 to set the oscillation frequency of the local oscillation circuit 123 shifted over the entire area of the frequency bandwidth when receiving a first control signal S17a from the control circuit 17 and outputs the signal S124 to set the oscillation frequency of the local oscillation circuit 123 to a frequency designated by the second control signal S17b when receiving a second control signal S17b.

When the second control signal S17b is received, signal S124 is output to the local oscillation circuit 123 to cause it to oscillate at a frequency higher or than the frequency of the carrier wave of the receive channel by exactly an intermediate frequency.

The AGC 125 amplifies the intermediate frequency signal S122 from the mixing circuit 122 by a predetermined gain at the time of input of the first control signal S17a from the control circuit 17 and adjusts the intermediate frequency signal level to a level set In advance at the time of non-input of the first control signal S17a.

Namely, the AGC 125 acts as an ordinary amplifier at the time of input of the first control signal S17a and acts as a so-called AGC at the time of non-input. The A/D converter 13 converts an analog signal S125 output from the AGC 125 to a digital signal S13, then outputs the same to the demodulation circuit 14 and the discrimination circuit 15.

The discrimination circuit 15 receives the digital signal S13 from the A/D converter 13 and discriminates the positions of the channels in the entire area within the frequency bandwidth of the high frequency signal, more specifically predicts and discriminates the positions of the carriers, stores the result of discrimination in the storage device 16, and, when the discrimination operation in the entire area within the frequency bandwidth is ended, outputs the signal S15 to the control circuit 17 so as to inform it of the end.

Figure 3:
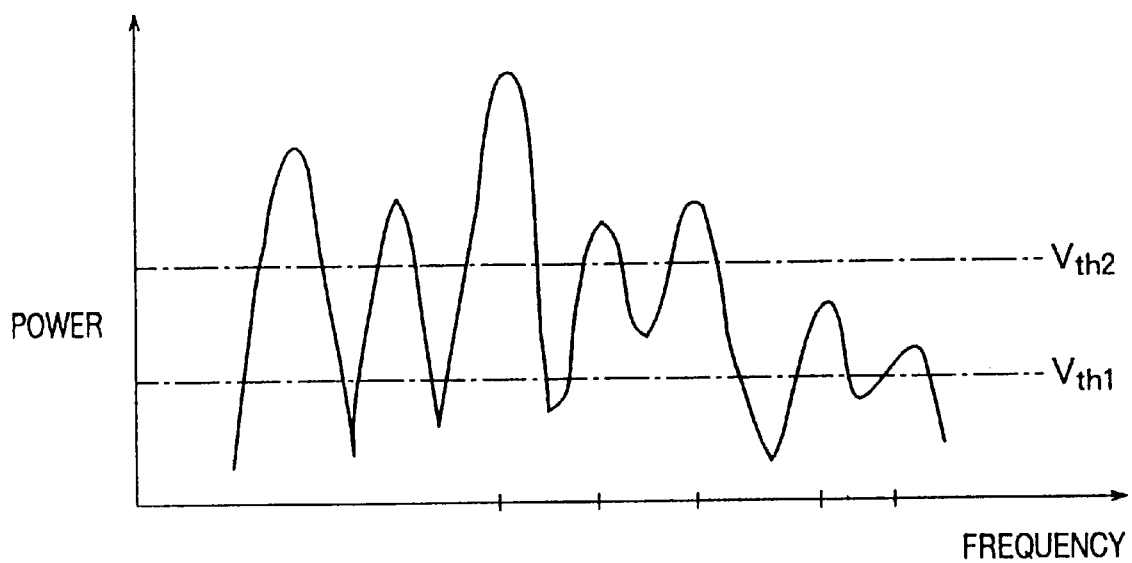
FIG. 3 is an explanatory view of a concrete example of the discrimination of a carrier position according to the present invention.

A specific carrier position discrimination operation of the discrimination circuit 15, as shown in FIG. 3 for example, uses two reference levels Vth1 and Vth2 and predicts a peak position of the signal from a region in which the level of the input signal is larger than at least Vth2 among the two reference levels Vth1 and Vth2.

Figure 4:
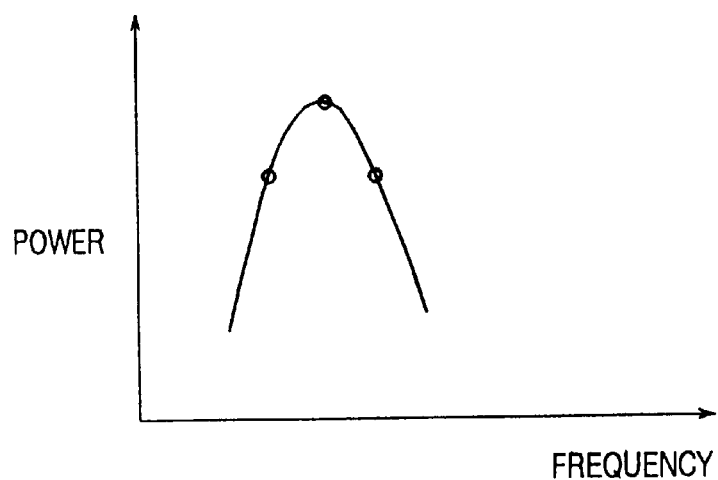
FIG. 4 is an explanatory view of another concrete example of the discrimination of a carrier position according to the present invention.
Figure 5:
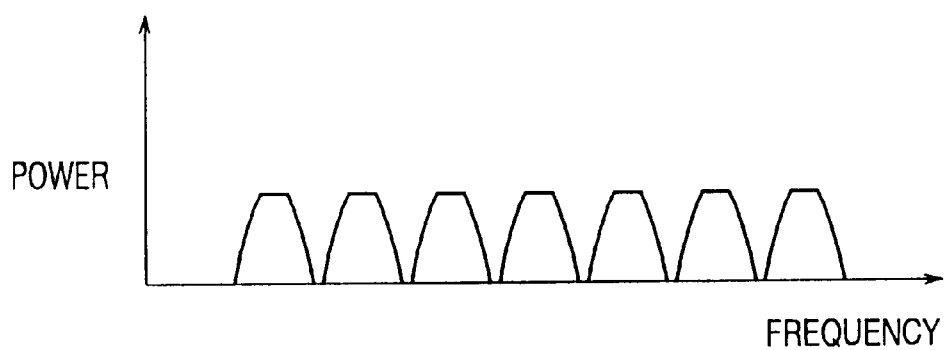
FIG. 5 is an explanatory view of the signal waveform of the received channel data and an explanatory view of another concrete example of the discrimination of a carrier position according to the present invention.

Further, as the method for discrimination of a carrier position, for example, as shown in FIG. 4, it is also possible to take three points a, b, and c and determine that the signal has peaked when the data changes from large to small (the point of change of Inclination is defined as the peak). Further, since the peak part of the waveform of a usual received signal is shaped substantially trapezoidally, it is also possible to predict and discriminate the valley portion in place of determining the peak portion so as to discriminate a carrier position.

In this case, when predicting the peak position in a region small than the above reference level or using the three-point method, the point where the data changes from small to large is determined as a valley portion to predict the peak position.

The storage device 16 is constituted by for example a nonvolatile and electrically rewritable memory. The storage data thereof is referred to by the control circuit 17.

The control circuit 17 first outputs a first control signal S17a to the channel selection control circuit 124 and AGC 125 of the channel selection circuit 12, makes the discrimination circuit 15 discriminate the channel positions over the entire area within the frequency bandwidth, then receives the signal S15, stops the output of the first control signal S17a, generates a second control signal S17b for selectively setting the frequency of the local oscillation circuit 123 based on the result of discrimination of the discrimination circuit 15 stored in the storage device 16, and outputs the same to the channel selection control circuit 124. Further, the control circuit 17 outputs the first control signal S17a to the demodulation circuit 14 and holds the demodulation circuit 14 in the non-operation state during the period of output of the first control signal S17a.

Next, an explanation will be made of the operation in the above configuration.

A high frequency signal sent for example from a broadcast satellite is received at the reception antenna 11, amplified at the high frequency amplification circuit 121 of the channel selection circuit 14, and input as the signal S121 to the mixing circuit 122.

The mixing circuit 122 mixes the received high frequency signal S121 with the local oscillation signal S123 from the local oscillation circuit 123 to convert the same to an intermediate frequency signal which it then outputs as a signal S122 to the AGC 125. At this time, the first control signal S17a from the control circuit 17 has been input to the AGC 125, and the automatic gain adjustment function thereof has been released. Accordingly, the intermediate frequency signal S122 is amplified with the predetermined gain and further converted to the digital signal S13 at the A/D converter 13 and output to the demodulation circuit 14 and the discrimination circuit 15.

Further, at this time, the first control signal S17a has been input to the channel selection control circuit 124 by the control circuit 17. The oscillation frequency of the local oscillation circuit 123 Is set shifted over the entire area within the frequency bandwidth. Namely, a channel search is carried out over the entire area. At this time, for example, the demodulation circuit 14 is held in a stopped (non-operation) state by the control circuit 17.

The discrimination circuit 15, for example, compares the level with the reference levels Vth1 and Vth2 set in advance and discriminates the received channel position in the region where the level is larger than the reference levels. The result of the discrimination is stored in the storage device 16.

When the high speed channel search performed over the entire area within this frequency bandwidth is ended, the signal S15 is output from the discrimination circuit 15 to the control circuit 17.

Then, the control circuit 17 generates a second control signal S17b so as to set the oscillation frequency of the local oscillation circuit 123 to a frequency based on the channel position information in the frequency bandwidth stored in the storage device 16 and outputs it to the channel selection control circuit 124. Further, at this time, along with the stopping of the output of the first control signal S17a from the control circuit 17, the demodulation circuit 14 is switched to the operation state. Simultaneously, the output of the first control signal S17a to the AGC 125 is stopped, so the AGC 125 enters the automatic gain adjustment mode and the level-adjusted intermediate frequency signal S125 is converted to a digital signal S13 at the A/D converter 13 and input to the demodulation circuit 14.

By this, it is possible to selectively search for a channel based on a rough channel position specified by the discrimination circuit 15, that is, not over the entire area within the frequency bandwidth. The intermediate frequency signal which was obtained by this selective search and adjusted in level is input to the demodulation circuit 14. The demodulation circuit 14 then selectively carries out the demodulation operation with respect to the selected channel signal and obtains the channel data.

As explained above, according to the present embodiment, since provision is made of the channel selection circuit 12 provided with the variable oscillation frequency local oscillation circuit 123, the channel selection control circuit 124 which sets the oscillation frequency of the local oscillation circuit 123 shifted over the entire area within the frequency bandwidth when receiving the first control signal S17a and sets the oscillation frequency of the local oscillation circuit 123 to a frequency designated by the second control signal S17b when receiving the second control signal S17b, the mixing circuit 122 which mixes the received high frequency signal S121 with the local oscillation signal S123 from the local oscillation circuit 123 to convert the same to the intermediate frequency signal which it then outputs, and the AGC 125 which amplifies the intermediate frequency signal from the mixing circuit 122 with the predetermined gain at the time of input of the first control signal S17a and adjusts the intermediate frequency signal level to the level set in advance at the time of non-input of the first control signal; the A/D converter 13 which converts the analog signal of the AGC 125 to the digital signal; the discrimination circuit 15 which receives the digital signal S13 and discriminates the position of each-channel in the entire area within the frequency bandwidth; and the control circuit 17 which outputs the first control signal S17a to the channel selection control circuit 124 and the AGC 125, makes the discrimination circuit 15 discriminate the channel positions over the entire area within the frequency bandwidth, and then stops the output of the first control signal S17a and outputs the second control signal S17b for setting the frequency of the local oscillation circuit 123 based on the result of discrimination of the discrimination circuit 15 to the channel selection control circuit 123, it is possible to first perform a high speed search for viewing just the output level of the channel selection circuit 12, then perform the time consuming demodulation operation only near the position where a carrier was found, so there is an advantage such that the channel search time can be shortened.

As explained above, according to the present invention, it is possible to realize a channel search device with which the channel search time can be shortened.

Note that the present invention is not limited to the above embodiments and can be modified in various ways within the scope of the present invention.

What is claimed is:

1. A receiving apparatus which receives a high frequency signal having individual frequencies allocated as channels in a predetermined frequency bandwidth and demodulates the data of a channel, comprising:

a local oscillation circuit for generating a variable oscillation frequency, a channel selection control circuit for setting the oscillation frequency of the local oscillation circuit, said oscillation frequency being shifted over the entire area in the frequency bandwidth when a first control signal is received, wherein said channel selection control circuit sets the oscillation frequency of the local oscillation circuit to a frequency designated by a second control signal, a mixing circuit for mixing the received high frequency signal with the local oscillation signal from the local oscillation circuit to convert the same to an intermediate frequency signal, a discrimination circuit for receiving an intermediate frequency signal output from the mixing circuit, discriminating the position of each channel in the entire area in the frequency bandwidth, and storing the result of that discrimination, a demodulation circuit, connected to the outputs of an analog-digital converter and discrimination circuit, and a control circuit for outputting the first control signal to the channel selection control circuit while simultaneously holding said demodulation circuit disabled, wherein upon completion of said discrimination process, said control circuit then stops outputting said first control signal, and outputs the second control signal for setting the frequency of the local oscillation circuit to the channel selection control circuit based on the output of the discrimination circuit, whereupon said stopping of said first control signal results in switching the demodulation circuit from a disabled to an operational state and allowing demodulation to be performed only on those channels which were stored by said discrimination circuit.

2. A receiving apparatus as set forth in claim 1, wherein the discrimination circuit compares the level of the input intermediate frequency signal with at least one reference level set in advance so as to discriminate the position of a received channel.

3. A receiving apparatus as set forth in claim 2, wherein the discrimination circuit discriminates the position of a received channel from the level of the intermediate frequency signal larger than the reference level.

4. A receiving apparatus as set forth in claim 2, wherein the discrimination circuit discriminates the position of a received channel from the level of the intermediate frequency signal smaller than the reference level.

5. A receiving apparatus as set forth in claim 2, wherein the discrimination circuit discriminates the position of a received channel by detecting a point of change of inclination of the input intermediate frequency signal.

6. A receiving apparatus as set forth in claim 5, wherein the discrimination circuit discriminates the position of a received channel by detecting a point of change of inclination of a peak portion of the input intermediate frequency signal.

7. A receiving apparatus as set forth in claim 5, wherein the discrimination circuit discriminates the position of a received channel by detecting a point of change of inclination of a valley portion of the input intermediate frequency signal.

8. A receiving apparatus as set forth in claim 1, wherein the high frequency signal is a digital broadcast use signal.

9. A receiving apparatus which receives a high frequency signal having individual frequencies allocated as channels in a predetermined frequency bandwidth and demodulates the data of a channel, comprising:

a local oscillation circuit for generating a variable oscillation frequency, a channel selection control circuit for setting the oscillation frequency of the local oscillation circuit, said oscillation frequency being shifted over the entire area in the frequency bandwidth when a first control signal is received, wherein said channel selection control circuit sets the oscillation frequency of the local oscillation circuit to a frequency designated by a second control signal, a mixing circuit for mixing the received high frequency signal with the local oscillation signal from the local oscillation circuit to convert the same to an intermediate frequency signal, a gain adjustment circuit for amplifying the intermediate frequency signal from the mixing circuit with a predetermined gain at the time of input of the first control signal and adjusts the level of the intermediate frequency signal to a level set in advance at the time of non-input of the first control signal, a discrimination circuit for receiving an intermediate frequency signal output from the mixing circuit, discriminating the position of each channel in the entire area in the frequency bandwidth, and storing the result of that discrimination, a demodulation circuit, connected to the outputs of an analog-digital converter and discrimination circuit, and a control circuit for outputting the first control signal to the channel selection control circuit and the gain adjustment circuit of the channel selection circuit while simultaneously holding said demodulation circuit disabled, then causing the discrimination circuit to discriminate the channel positions over the entire area in the frequency bandwidth, wherein upon completion of said discrimination process, said control circuit then stops outputting said first control signal, and outputs the second control signal for setting the frequency of the local oscillation circuit to the channel selection control circuit based on the output of the discrimination circuit, whereupon said stopping of said first control signal results in switching the demodulation circuit from a disabled to an operational state and allowing demodulation to be performed only on those channels which were stored by said discrimination circuit.

10. A receiving apparatus as set forth in claim 9, wherein the discrimination circuit compares the level of the input intermediate frequency signal with at least one reference level set in advance so as to discriminate the position of a received channel.

11. A receiving apparatus as set forth in claim 10, wherein the discrimination circuit discriminates the position of a received channel from the level of the intermediate frequency signal larger than the reference level.

12. A receiving apparatus as set forth in claim 10, wherein the discrimination circuit discriminates the position of a received channel from the level of the intermediate frequency signal smaller than the reference level.

13. A receiving apparatus as set forth in claim 10, wherein the discrimination circuit discriminates the position of a received channel by detecting a point of change of inclination of the input intermediate frequency signal.

14. A receiving apparatus as set forth in claim 13, wherein the discrimination circuit discriminates the position of a received channel by detecting a point of change of inclination of a peak portion of the input intermediate frequency signal.

15. A receiving apparatus as set forth in claim 13, wherein the discrimination circuit discriminates the position of a received channel by detecting a point of change of inclination of a valley portion of the input intermediate frequency signal.

16. A receiving apparatus as set forth in claim 9, wherein the high frequency signal is a digital broadcast use signal.

17. A receiving apparatus which receives a high frequency signal having individual frequencies allocated as channels in a predetermined frequency bandwidth and demodulates the data of a channel, comprising:

a local oscillation circuit for generating a variable oscillation frequency, a channel selection control circuit for setting the oscillation frequency of the local oscillation circuit shifted over the entire area in the frequency bandwidth when a first control signal is received and sets the oscillation frequency of the local oscillation circuit to a frequency designated by a second control signal when a second control signal is received, a mixing circuit for mixing the received high frequency signal with the local oscillation signal from the local oscillation circuit to convert the same to an intermediate frequency signal which it then outputs, a discrimination circuit for receiving an intermediate frequency signal output from the mixing circuit and discriminates the position of each channel in the entire area in the frequency bandwidth, and a control circuit for outputting the first control signal to the channel selection control circuit of the channel selection circuit to discriminate the channel positions over the entire area in the frequency bandwidth by the discrimination circuit, then outputs the second control signal for setting the frequency of the local oscillation circuit to the channel selection control circuit based on the result of discrimination of the discrimination circuit, wherein the discrimination circuit compares the level of the input intermediate frequency signal with at least one reference level set in advance so as to discriminate the position of a received channel, and the discrimination circuit discriminates the position of a received channel from the level of the intermediate frequency signal larger than the reference level.

18. A receiving apparatus which receives a high frequency signal having individual frequencies allocated as channels in a predetermined frequency bandwidth and demodulates the data of a channel, comprising:

a local oscillation circuit for generating a variable oscillation frequency, a channel selection control circuit for setting the oscillation frequency of the local oscillation circuit shifted over the entire area in the frequency bandwidth when a first control signal is received and sets the oscillation frequency of the local oscillation circuit to a frequency designated by a second control signal when a second control signal is received, a mixing circuit for mixing the received high frequency signal with the local oscillation signal from the local oscillation circuit to convert the same to an intermediate frequency signal, which it then outputs, a gain adjustment circuit for amplifying the intermediate frequency signal from the mixing circuit with a predetermined gain at the time of input of the first control signal and adjusts the level of the intermediate frequency signal to a level set in advance at the time of non-input of the first control signal, a discrimination circuit for receiving an intermediate frequency signal output from the mixing circuit and discriminates the position of each channel in the entire area in the frequency bandwidth and a control circuit for outputting the first control signal to the channel selection control circuit and the gain adjustment circuit of the channel selection circuit, which causes the discrimination circuit to discriminate the channel positions over the entire area in the frequency bandwidth, then stops the output of the first control circuit and outputs the second control signal for setting the frequency of the local oscillation circuit to the channel selection control circuit based on the result of discrimination of the discrimination circuit, wherein the discrimination circuit compares the level of the input intermediate frequency signal with at least one reference level set in advance so as to discriminate the position of a received channel, and the discrimination circuit discriminates the position of a received channel from the level of the intermediate frequency signal larger than the reference level.

* * * * *